United States Patent
Tsuji et al.

(10) Patent No.: US 9,885,112 B2
(45) Date of Patent: Feb. 6, 2018

(54) FILM FORMING APPARATUS

(71) Applicant: ASM IP Holding B.V., Almere (NL)

(72) Inventors: Naoto Tsuji, Suginami-ku (JP); Kazuo Sato, Kawasaki (JP); Takayuki Yamagishi, Kashiwazaki (JP)

(73) Assignee: ASM IP HOLDINGS B.V., Almere (NL)

(*) Notice: Subject to any disclaimer, the term of this patent is extended or adjusted under 35 U.S.C. 154(b) by 297 days.

(21) Appl. No.: 14/557,774

(22) Filed: Dec. 2, 2014

(65) Prior Publication Data
US 2016/0153088 A1 Jun. 2, 2016

(51) Int. Cl.
| | | |
|---|---|---|
| *C23F 1/00* | (2006.01) | |
| *H01L 21/306* | (2006.01) | |
| *C23C 16/44* | (2006.01) | |
| *C23C 16/455* | (2006.01) | |
| *H01J 37/32* | (2006.01) | |

(52) U.S. Cl.
CPC ...... *C23C 16/4412* (2013.01); *C23C 16/4408* (2013.01); *C23C 16/45544* (2013.01); *C23C 16/45565* (2013.01); *H01J 37/3244* (2013.01)

(58) Field of Classification Search
CPC .............. C23C 16/45565; H01J 37/3244
USPC .................................... 156/345.34
See application file for complete search history.

(56) References Cited

U.S. PATENT DOCUMENTS

| | | | | |
|---|---|---|---|---|
| 4,987,856 A | * | 1/1991 | Hey ............. | C23C 16/455 118/715 |
| 6,025,575 A | * | 2/2000 | Park .............. | C23C 16/45565 118/725 |
| 7,361,228 B2 | * | 4/2008 | Choi ............. | H01J 37/3244 118/715 |
| 2002/0069969 A1 | * | 6/2002 | Rose ............. | C23C 16/45565 156/345.34 |
| 2005/0223987 A1 | * | 10/2005 | Iwata ............ | C23C 16/34 118/715 |
| 2005/0229848 A1 | | 10/2005 | Shinriki et al. | |
| 2014/0103145 A1 | | 4/2014 | White et al. | |
| 2015/0152551 A1 | * | 6/2015 | Yamaguchi ..... | C23C 16/45565 438/785 |

* cited by examiner

*Primary Examiner* — Keath T Chen
(74) *Attorney, Agent, or Firm* — Studebaker & Brackett PC (57) ABSTRACT

A film forming apparatus includes a susceptor, and a shower head provided above the susceptor and having a first passage and a second passage independent of the first passage formed therein, wherein the first passage is formed through the shower head by being provided with a first cavity surrounded by a first upper wall and a first lower wall, a first thin hole formed in the first upper wall, and a plurality of second thin holes formed in the first lower wall, the height of the first upper wall in the vertical direction is reduced with increase in distance from the first thin hole, and the second passage is formed in the same manner as the first passage.

6 Claims, 7 Drawing Sheets

FIG.7
comparative example

FIG.8
comparative example

FILM FORMING APPARATUS

BACKGROUND OF THE INVENTION

Field of the Invention

The present invention relates to a film forming apparatus for growing a film on a substrate.

Background Art

In plasma enhanced atomic layer deposition (PE-ALD) or atomic layer deposition (ALD) for example, a gas passed through a shower head is supplied to a substrate on a susceptor. US2005/0229848A1 discloses a film forming apparatus having a shower head in which two independent flow passages are formed.

A shower head in which a first passage and a second passage are formed is used as described below. First, a first gas supplied via the first passage is provided to a substrate. After the provision of the first gas, only purge gas is caused to flow through the first passage, thereby purging the first passage. Next, a second gas supplied via the second passage is provided to the substrate. After the provision of the second gas, only purge gas is caused to flow through the second passage, thereby purging the second passage. This sequence of operations is repeated to alternately supply the first gas and the second gas to the substrate.

If the second gas remains in the second passage when the first gas is supplied to the substrate, or if the first gas remains in the first passage when the second gas is supplied to the substrate, degradation in film forming quality occurs. It has been necessary to increase the purge time for avoidance of degradation in film forming quality. It is preferable to form first and second passages capable of being rapidly purged in order to avoid this drawback.

SUMMARY OF THE INVENTION

The present invention has been achieved to solve the above-described problem, and an object of the present invention is to provide a film forming apparatus having a shower head capable of rapidly purging gas flow passages.

The features and advantages of the present invention may be summarized as follows.

According to one aspect of the present invention, a film forming apparatus includes a susceptor, and a shower head provided above the susceptor and having a first passage and a second passage independent of the first passage formed therein, wherein the first passage is formed through the shower head by being provided with a first cavity surrounded by a first upper wall and a first lower wall and extending horizontally, a first thin hole formed in the first upper wall, and a plurality of second thin holes formed in the first lower wall, the height of the first upper wall in the vertical direction is reduced with increase in distance from the first thin hole, the height of the first lower wall in the vertical direction is constant, the second passage is formed through the shower head by being provided with a second cavity surrounded by a second upper wall and a second lower wall and extending horizontally, a third thin hole formed in the second upper wall, and a plurality of fourth thin holes formed in the second lower wall, the height of the second upper wall in the vertical direction is reduced with increase in distance from the third thin hole, and the height of the second lower wall in the vertical direction is constant.

Other and further objects, features and advantages of the invention will appear more fully from the following description.

DETAILED DESCRIPTION OF THE PREFERRED EMBODIMENTS

A film forming apparatus according to an embodiment of the present invention will be described with reference to drawings. Components identical or corresponding to each other are indicated by the same reference characters, and repeated description of them is omitted in some cases.

First Embodiment

Figure 1:
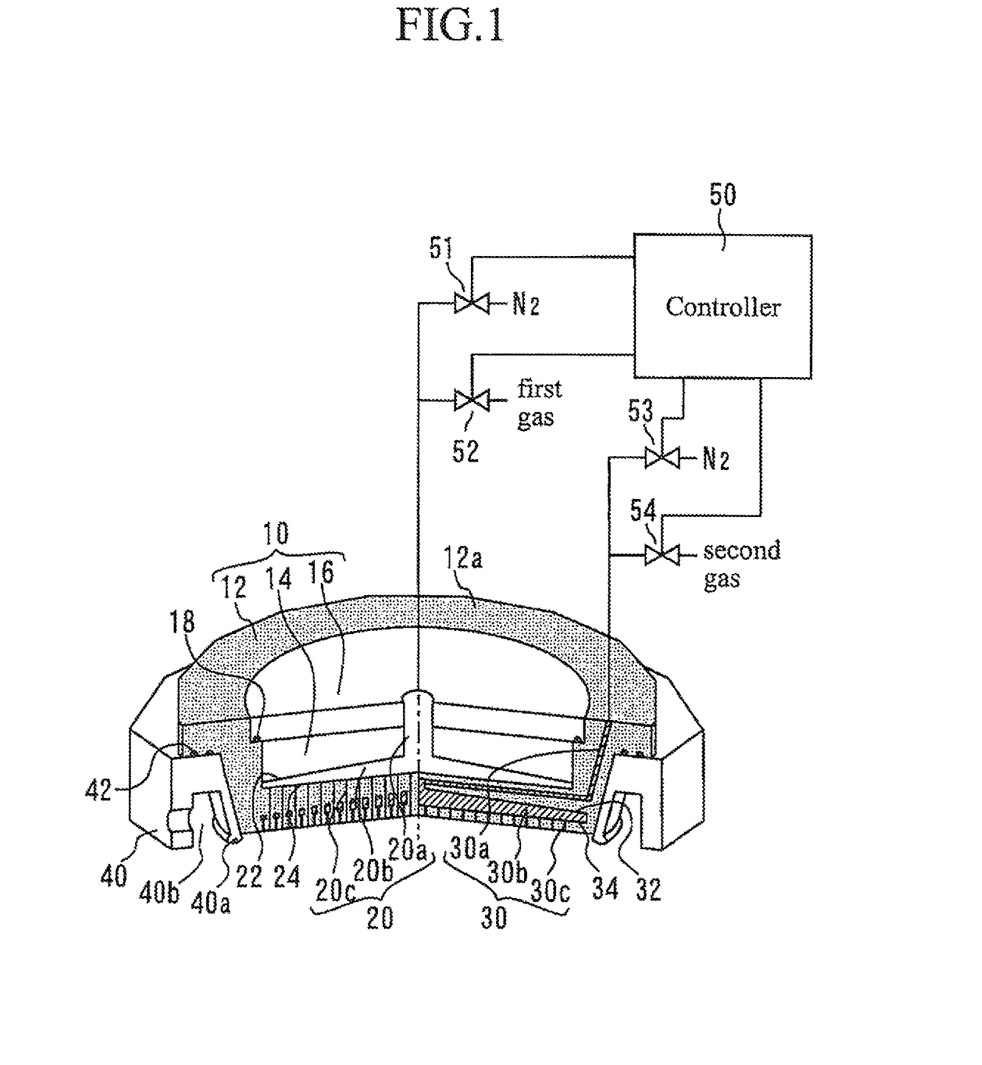
FIG. 1 is a sectional perspective view of a portion of a film forming apparatus according to a first embodiment.

FIG. 1 is a sectional perspective view of a portion of a film forming apparatus according to a first embodiment of the present invention. The film forming apparatus is provided with a shower head 10. The shower head 10 is provided to supply a gas uniform in density to a surface of a substrate. The shower head 10 has a base plate 12, a middle plate 14 and an upper plate 16. The base plate 12 and the middle plate 14 are disposed so as to provide a gap therebetween. The upper plate 16 is placed on the base plate 12 and the middle plate 14. The upper plate 16 compressively deforms an O-ring 18 on the base plate 12. The middle plate 14 and the upper plate 16 may be formed into one integral plate made of ceramic for example.

In the shower head 10, a first passage 20 and a second passage 30 independent of the first passage 20 are formed. The shower head 10 is thus formed as a double shower head. The first passage 20 has a first thin hole 20a, a first cavity 20b and a plurality of second thin holes 20c. The first thin hole 20a is a thin hole formed in the middle plate 14 and the upper plate 16 and extending vertically. As first thin hole 20a, a flow passage from a center of an upper surface of the shower head 10 to the first cavity 20b is provided. The first cavity 20b extends horizontally. The first cavity 20b is a region surrounded by a first upper wall 22, which is the lower surface of the middle plate 14, and a first lower wall 24, which is the upper surface of the base plate 12.

The second thin holes 20c are thin holes formed in the base plate 12 and extending vertically. The second thin holes 20c lead a gas from the first cavity 20b to a region below the base plate 12. A plurality of the second thin holes 20c are formed at equal intervals in the first lower wall 24. Thus, the first passage 20 is formed through the shower head 10 by being provided with the first cavity 20b, the first thin hole 20a formed in the first upper wall 22 and the plurality of second thin holes 20c formed in the first lower wall 24.

The second passage 30 has a third thin hole 30a, a second cavity 30b and a plurality of fourth thin holes 30c. The third thin hole 30a is a thin hole formed in the base plate 12 so as to provide communication between an peripheral position in an upper surface 12a of the shower head 10 and a center (a portion indicated by a dot-dash line) of the shower head 10. As third thin hole 30a, a flow passage from the upper surface 12a side of the base plate 12 to the second cavity 30b is provided. The second cavity 30b extends horizontally. The second cavity 30b is a region surrounded by a second upper wall 32 and second lower wall 34 formed in the base plate 12.

Thus, the second passage 30 is formed through the shower head 10 by being provided with the second cavity 30b, the third thin hole 30a formed in the second upper wall 32 and the plurality of fourth thin holes 30c formed in the second lower wall 34.

Each of the first cavity 20b and the second cavity 30b is a space extending through the entire region right below the upper plate 16 as viewed in plan. The second thin holes 20c are formed at a constant density right below the first cavity 20b, while the fourth thin holes 30c are formed at a constant density right below the second cavity 30b. The second thin holes 20c are formed not only on the left-hand side of the dot-dash line in FIG. 1 but also on the right-hand side of the dot-dash line.

The shower head 10 is placed on an annular exhaust duct 40 surrounding the shower head 10. An O-ring 42 provided on the exhaust duct 40 is elastically deformed by the shower head 10 put on the O-ring 42. The exhaust duct 40 has a projecting portion 40a in contact with a side surface of the base plate 12. An annular exhaust passage 40b is formed outside the shower head 10 by the projecting portion 40a.

A gas supply system is provided outside the shower head 10. An $N_2$ gas source is connected to the first thin hole 20a through a valve 51, and a gas source for supplying a first gas is connected to the first thin hole 20a through a valve 52. An $N_2$ gas source is connected to the third thin hole 30a through a valve 53, and a gas source for supplying a second gas is connected to the third thin hole 30a through a valve 54. Opening and closing of the four valves 51, 52, 53, and 54 are controlled by a controller 50.

Figure 2:
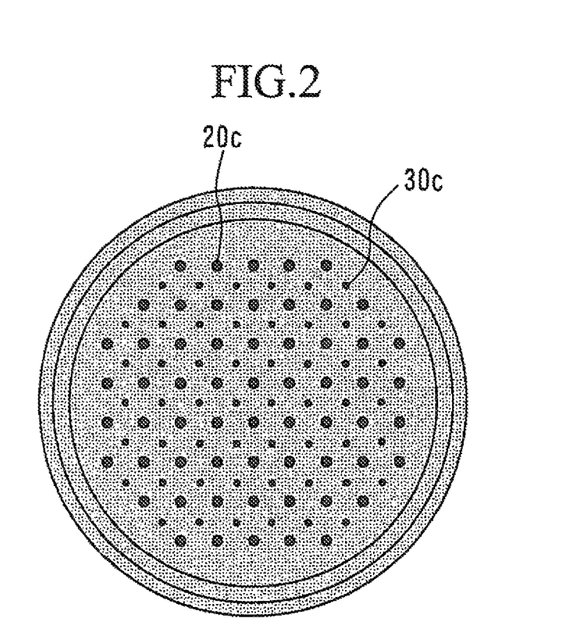
FIG. 2 is a bottom view of the base plate.

FIG. 2 is a bottom view of the base plate 12. The second thin holes 20c and the fourth thin holes 30c are formed at a constant density in the bottom surface of the base plate 12. The second thin holes 20c and the fourth thin holes 30c are formed through the entire bottom surface of the shower head 10.

Figure 3:
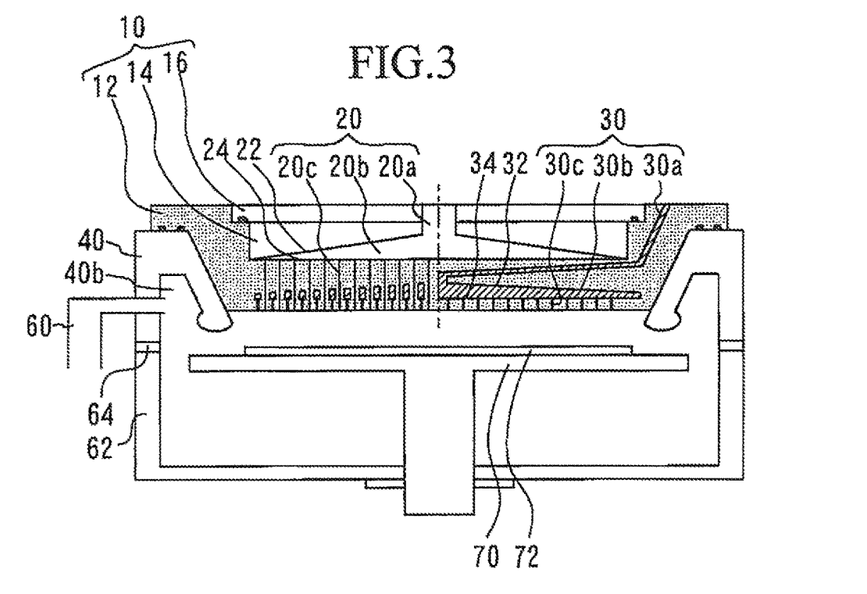
FIG. 3 is a sectional view of the film forming apparatus according to the first embodiment.

FIG. 3 is a sectional view of the film forming apparatus according to the first embodiment of the present invention. The first upper wall 22 is lower in height in the vertical direction at positions remoter from the first thin hole 20a. In other words, the first upper wall 22 is a slanting surface reduced in height in the vertical direction going away from the center of the shower head 10 toward an outer portion of the shower head 10. The height of the first lower wall 24 in the vertical direction is constant.

The second upper wall 32 is lower in height in the vertical direction at positions remoter from the third thin hole 30a (a point of connection between the third thin hole 30a and the second cavity 30b). In other words, the second upper wall 32 is a slanting surface reduced in height in the vertical direction going away from the center of the shower head 10 toward an outer portion of the shower head 10. The height of the second lower wall 34 in the vertical direction is constant.

An exhaust tube 60 through which gas in the annular exhaust passage 40b is exhausted to the outside is attached to the exhaust duct 40. The exhaust duct 40 is placed on a chamber 62 with an annular plate 64 interposed therebetween. A susceptor 70 is provided in the chamber 62 below the shower head 10. The susceptor 70 has such a size that a wafer having a diameter of 300 mm or more for example is mounted on the susceptor 70. A substrate 72 is mounted on the susceptor 70. The substrate 72 is not particularly specified as long as it is an object on which a film is to be formed. The substrate 72 is, for example, a wafer having a diameter of 0.3 m.

Figure 4:
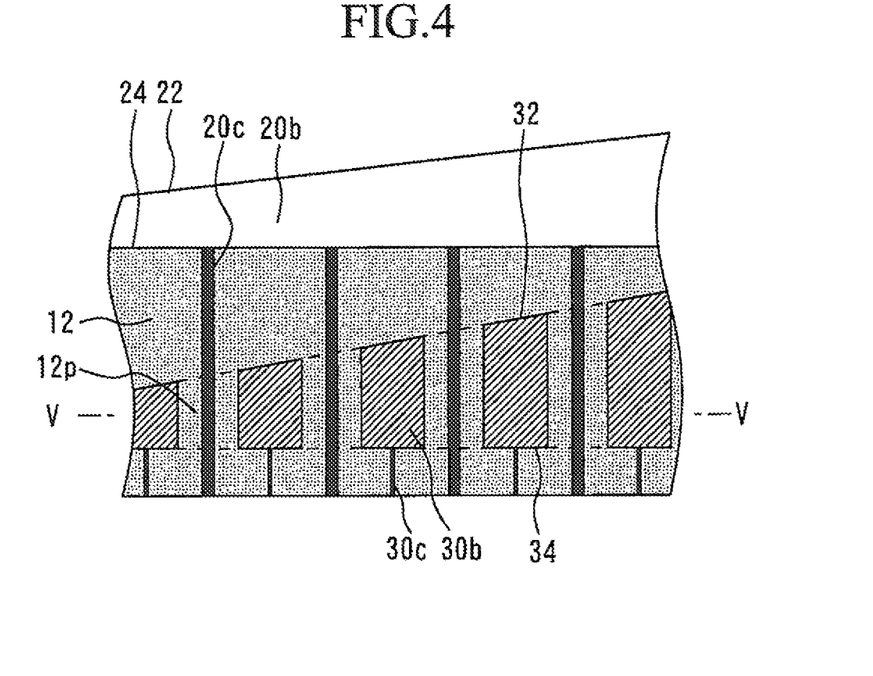
FIG. 4 is an enlarged view of a portion of the base plate.
Figure 5:
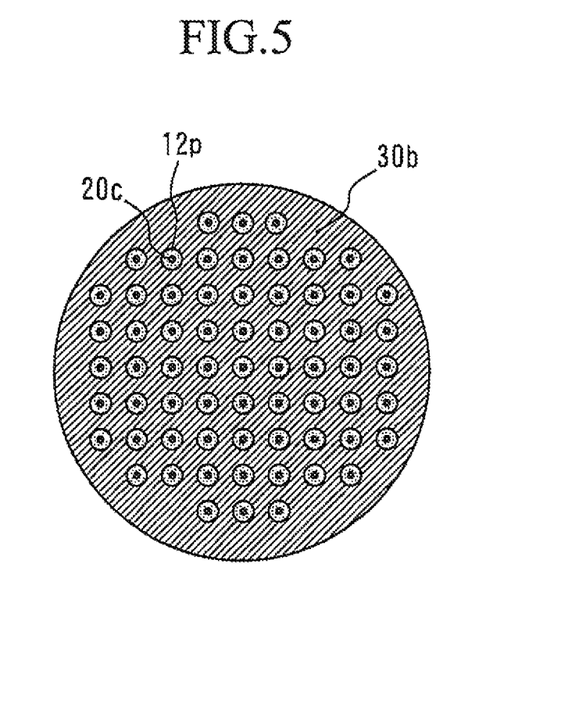
FIG. 5 is sectional view taken along line V-V in FIG. 4.

FIG. 4 is an enlarged view of a portion of the base plate 12 on the left-hand side of the dot-dash line in FIG. 3. Columns 12p are formed in the second cavity 30b. The second thin holes 20c extend vertically through the columns 12p. FIG. 5 is a sectional view taken along line V-V in FIG. 4. The columns 12p are provided at a constant density in the second cavity 30b. Each second thin hole 20c is formed at a center of the column 12p.

Figure 6:
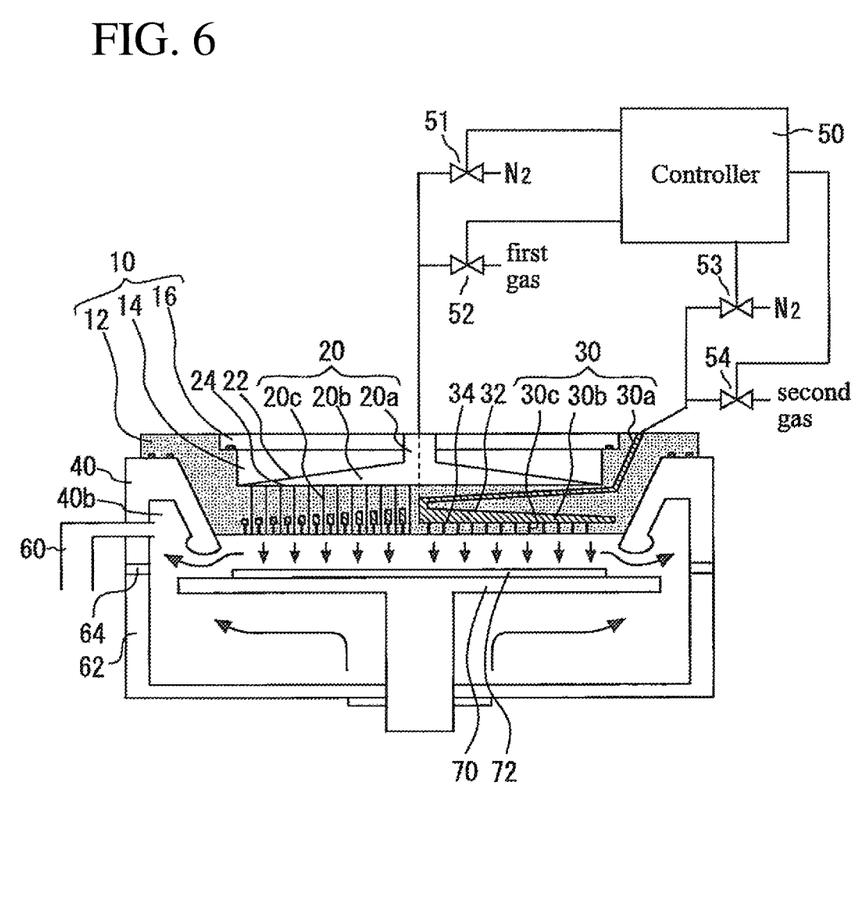
FIG. 6 is a diagram for explaining the method of film forming with the film forming apparatus according to the first embodiment.

The method of film forming using the film forming apparatus according to the first embodiment will be described. FIG. 6 is a diagram for explaining the method of film forming with the film forming apparatus according to the first embodiment. The valves 51 and 52 are first opened by the controller 50 to supply the first gas and $N_2$ gas to the first thin hole 20a. These gases spread in leftward and rightward directions (horizontal directions) in the first cavity 20b and are thereafter supplied from the plurality of second thin holes 20c onto the susceptor 70. The first gas then reacts with the substrate 72 to form a film on the substrate 72. The time period during which the valves 51 and 52 are open is referred to as a first film forming period.

Subsequently, the valve 52 is closed and only the inert gas ($N_2$ gas) is supplied to the first thin hole 20a, thereby purging the first passage 20 of the first gas. That is, the first gas is removed from the first passage 20, so that only the inert gas exists. The time period during which only the valve 51 is open is referred to as a first purge period.

During the first film forming period and the first purge period, the gas is supplied onto the susceptor 70 via the first thin hole 20a, the first cavity 20b and the plurality of second thin holes 20c. The gas having spread outward beyond the outer edge of the susceptor 70 is exhausted to the outside through exhaust duct 40 formed so as to surround the susceptor 70.

Subsequently, the valve 51 is closed and the valves 53 and 54 are opened. The second gas and $N_2$ gas are thereby supplied to the third thin hole 30a. The second gas and $N_2$ gas spread in leftward and rightward directions (horizontal directions) in the second cavity 30b and are thereafter supplied from the plurality of fourth thin holes 30c onto the susceptor 70. The second gas then reacts with the substrate 72 to form a film on the substrate 72. The time period during which the valves 53 and 54 are open is referred to as a second film forming period.

Subsequently, the valve 54 is closed and only the inert gas ($N_2$ gas) is supplied to the third thin hole 30a, thereby purging the second passage 30 of the second gas. That is, the second gas is removed from the second passage 30, so that only the inert gas exists. The time period during which only the valve 53 is open is referred to as a second purge period.

During the second film forming period and the second purge period, the gas is supplied onto the susceptor 70 via the third thin hole 30a, the second cavity 30b and the plurality of fourth thin holes 30c. The gas having spread outward beyond the outer edge of the susceptor 70 is exhausted to the outside through exhaust duct 40. This sequence of processing operations is repeated to alternately supply the first gas and the second gas to the substrate 72. The kinds of the first and second gases are not particularly specified. However, the first gas is, for example, a precursor, and the second gas is, for example, a reactive gas.

Figure 7:
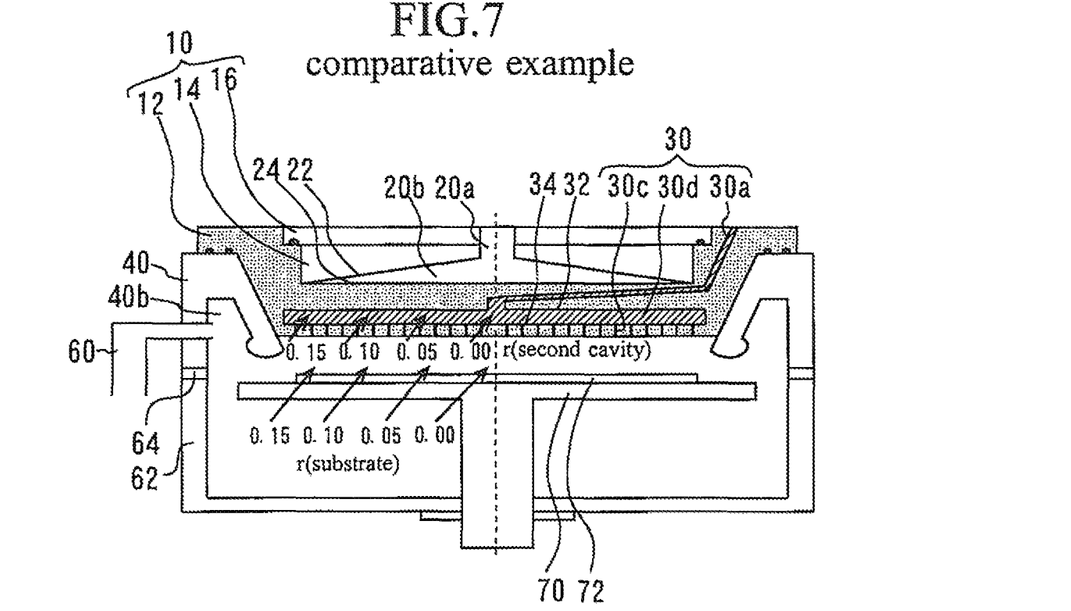
FIG. 7 is a sectional view of a film forming apparatus according to the comparative example.

A comparative example will now be described to facilitate understanding of the features of the present invention. FIG. 7 is a sectional view of a film forming apparatus according to the comparative example. The film forming apparatus in the comparative example differs from the film forming apparatus according to the first embodiment in that the height of the second upper wall 32 in the vertical direction is constant.

Figure 8:
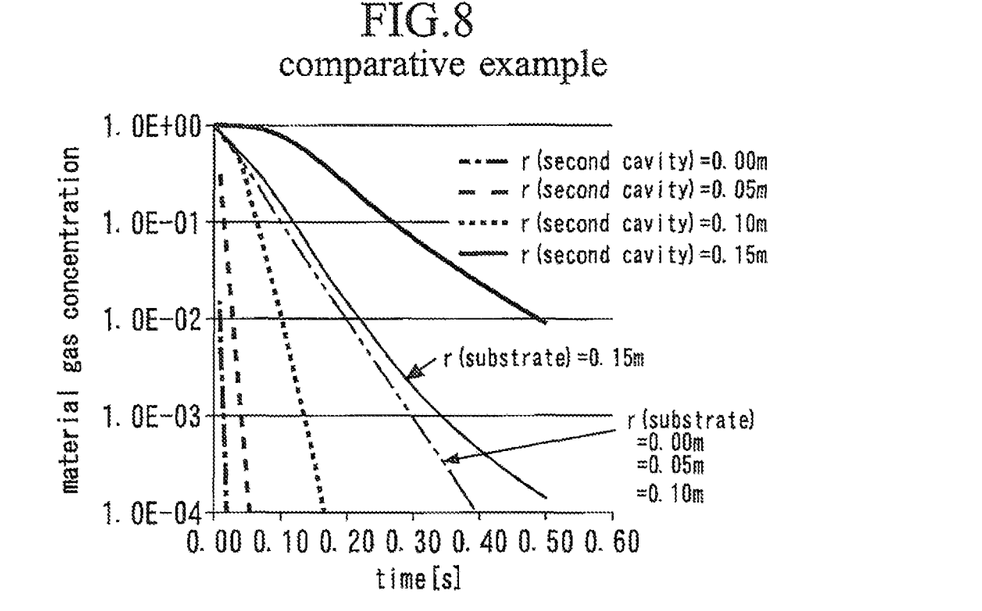
FIG. 8 shows simulation results.

FIG. 8 shows simulation results indicating the concentration of second gas during the second purge period in the film forming apparatus according to the comparative example. The second purge period begins at time 0. A symbol r (second cavity) represents the distance from the center (a portion indicated by a broken line) of the second cavity 30d in FIG. 7. An r (second cavity) point of 0.00 m designates a position in the second cavity 30d right above the center of the substrate 72. An r (second cavity) point of 0.15 m designates a position in the second cavity 30d right above the outermost periphery of the substrate 72. In FIG. 7, places corresponding to r (second cavity) values of 0.00, 0.05, 0.10, and 0.15 (m) are indicated. As can be understood from FIG. 8, the second gas becomes harder to exhaust with increase in r (second cavity) value. That is, it is difficult to purge the second gas in an outer region in the second cavity 30d.

A symbol r (substrate) represents the distance from the center (a portion indicated by a broken line) right above the substrate. The distance r (substrate) is indicated in FIG. 7. An r (substance) point of 0.00 m designates a position right above the center of the substrate 72. An r (substance) point of 0.15 m designates a position right above the outer edge of the substrate 72. As can be understood from FIG. 8, purge of the second gas at the position corresponding to the r (substrate) 0.15 m is retarded. The reason that purge of the second gas at the position corresponding to the r (substrate) 0.15 m is retarded is thought to be because purge at the position corresponding to the r (second cavity) value 0.15 m is retarded. Thus, the film forming apparatus according to the comparative example has the problem that the gas passage cannot be rapidly purged.

Figure 9:
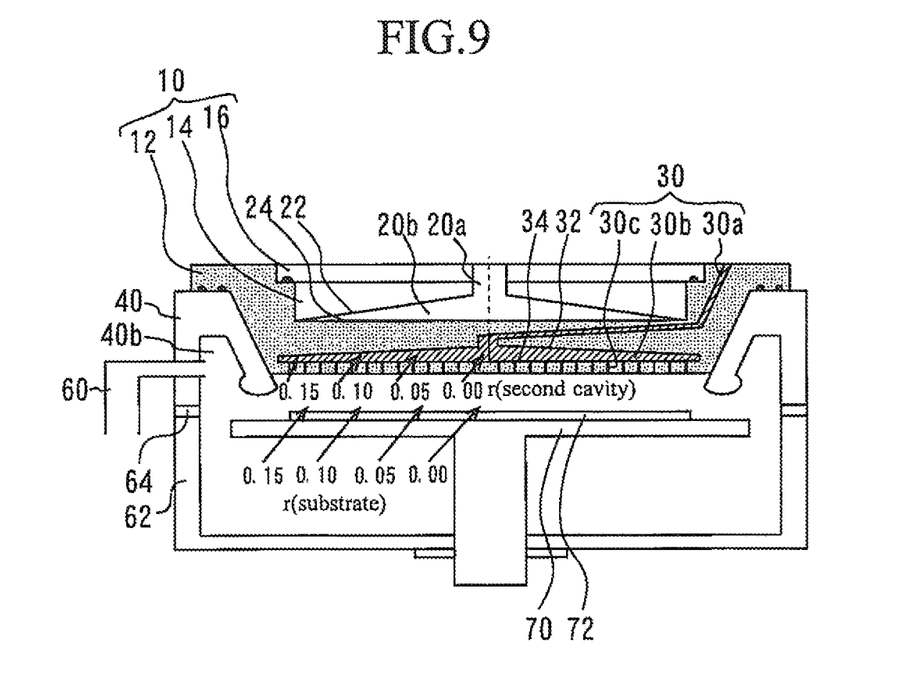
FIG. 9 is a diagram showing positions at which the concentration of the second gas is simulated.
Figure 10:
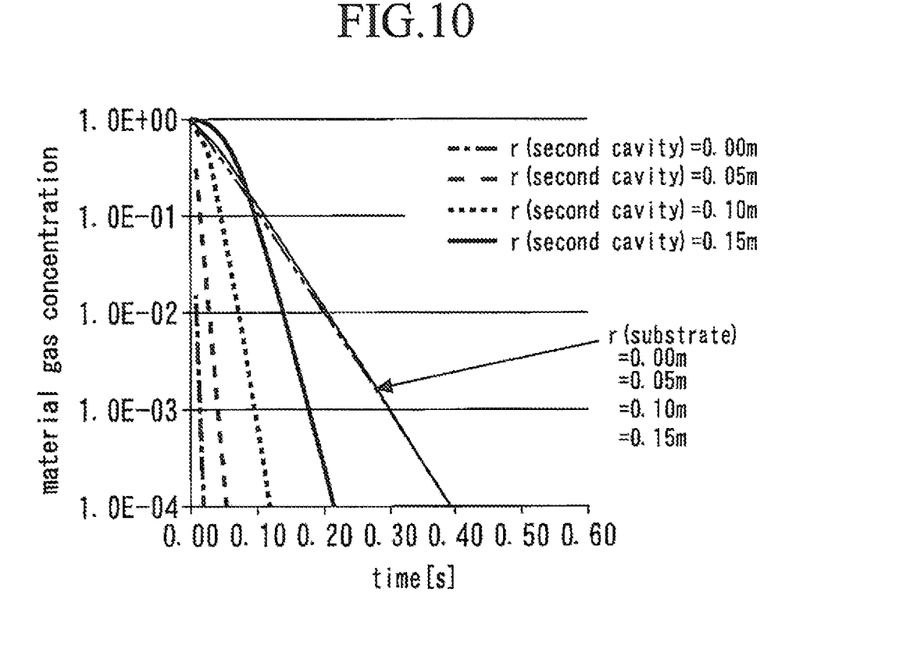
FIG. 10 shows simulation results.

In contrast, in the film forming apparatus according to the first embodiment of the present invention, the second passage 30 can be rapidly purged in the second purge period. Description about this will be made with reference to FIGS. 9 and 10. FIG. 9 is a diagram showing positions at which the concentration of the second gas is simulated. FIG. 10 shows simulation results showing changes in concentration of the second gas at the points indicated in FIG. 9.

As can be understood from FIG. 10, the second gas is purged in a time period of about 0.2 seconds at a peripheral position in the second cavity 30b (at a position corresponding to the r (second cavity) 0.15 m). Also, purge can be rapidly performed right above the substrate no matter what the value of r (substrate). Therefore, reducing the height of the second upper wall 32 in the vertical direction with increase in distance from the third thin hole 30a enables the second passage 30 to be rapidly purged. Since the shape of the first cavity 20b is the same as that of the second cavity 30b, the first passage 20 can also be rapidly purged.

The first thin hole 20a is formed in the first upper wall 22 right above the center of the susceptor 70. Therefore, the first gas supplied from the first thin hole 20a spreads radially in the first cavity 20b. Reducing the height of the first upper wall 22 in the vertical direction with increase in distance from the first thin hole 20a enables the first gas to easily spread radially in the first cavity 20b. As a result, the gas can easily reach a peripheral portion of the first cavity 20b, thus enabling the first passage 20 to be rapidly purged.

The third thin hole 30a is formed in the second upper wall 32 right above the center of the susceptor 70. Therefore, the second gas supplied from the third thin hole 30a spreads radially in the second cavity 30b. Reducing the height of the second upper wall 32 in the vertical direction with increase in distance from the third thin hole 30a enables the second gas to easily spread radially in the second cavity 30b. As a result, the gas can easily reach a peripheral portion of the second cavity 30b, thus enabling the second passage 30 to be rapidly purged.

The shower head 10 provided above the susceptor 70 can be modified in various ways. For example, the second thin holes 20c and the fourth thin holes 30c may be slits, not limited to round holes. The inert gas is not limited to $N_2$ gas. The inert gas may alternatively be, for example, Ar gas.

These modifications can also be applied as desired to embodiments described below. Film forming apparatuses according to embodiments described below have a number of commonalities with the first embodiment and will therefore be described mainly with respect to points of difference from the first embodiment.

Second Embodiment

Figure 11:
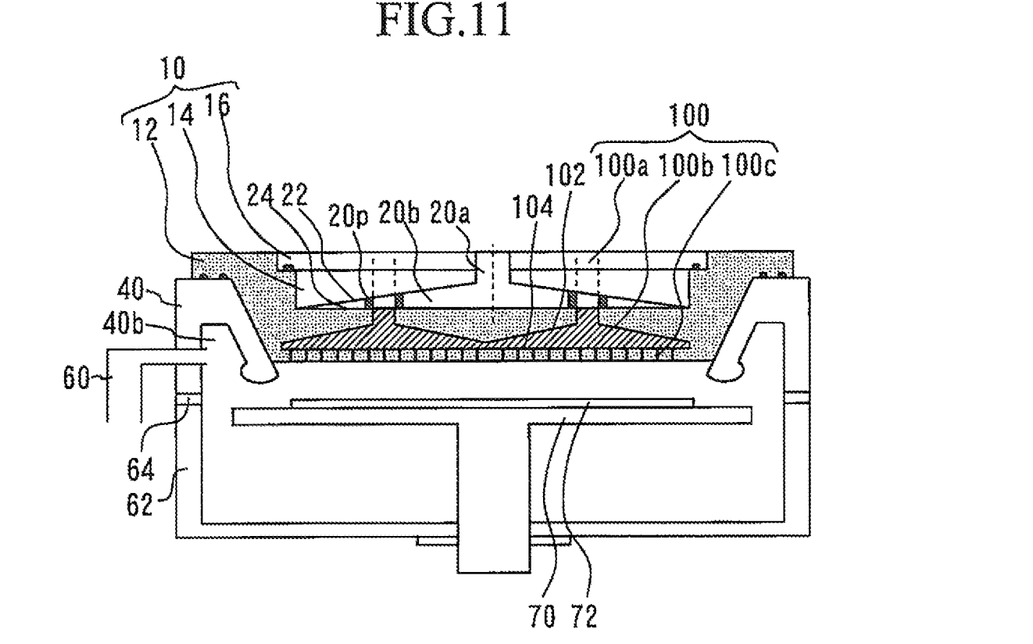
FIG. 11 is a sectional view of a film forming apparatus according to a second embodiment.

FIG. 11 is a sectional view of a film forming apparatus according to a second embodiment of the present invention. The same first passage as that in the first embodiment is provided. A second passage 100 includes a third thin hole 100a, a second cavity 100b and a plurality of fourth thin holes 100c. The third thin hole 100a is a thin hole formed in the middle plate 14 and the upper plate 16 and extending straight in the vertical direction. Also, the third thin hole 100a extends through a column 20p formed in the first cavity 20b. A plurality of third thin holes 100a are formed between a position right above a center of the region where the fourth thin holes 100c are formed and positions right above an outer edge of the region where the fourth thin holes 100c are formed. FIG. 11 shows a pair of third thin holes 100a.

The second cavity 100b is a region surrounded by a second upper wall 102 and a second lower wall 104. The height of the second upper wall 102 in the vertical direction is reduced with increase in distance from the third thin hole 100a, so that the height of the second upper wall 102 in the vertical direction is minimized at the position right above the center of the substrate 72 and at the position right above the outer edge of the substrate 72. The height of the second lower wall 104 in the vertical direction is constant.

According to the configuration of the second embodiment, the gas flow passage can be rapidly purged like that in the film forming apparatus according to the first embodiment. The third thin hole 100a is constituted only by a straight hole formed in the middle plate 14 and the upper plate 16. There is, therefore, no need to form a complicated hole such as the third thin hole 30a in the first embodiment. The number of third thin holes 100a is not limited to any particular number as long as it is plural.

Third Embodiment

Figure 12:
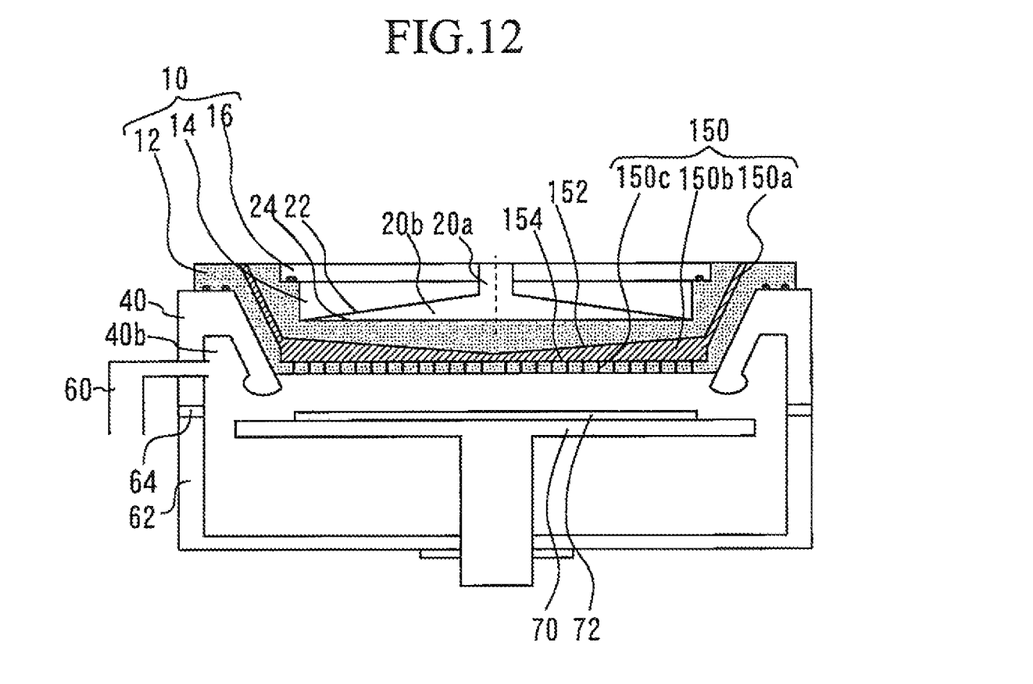
FIG. 12 is a sectional view of a film forming apparatus according to a third embodiment.

FIG. 12 is a sectional view of a film forming apparatus according to a third embodiment of the present invention.

The same first passage as that in the first embodiment is provided. A second passage 150 includes a third thin hole 150a, a second cavity 150b and a plurality of fourth thin holes 150c. The third thin hole 150a is a thin hole formed in the base plate 12.

The second cavity 150b is a region surrounded by a second upper wall 152 and a second lower wall 154. The third thin hole 150a is formed in a peripheral portion of the second upper wall 152. As third thin hole 150a, a flow passage from a peripheral position in an upper surface of the shower head to the second cavity 150b is provided. FIG. 12 shows a pair of third thin holes 150a.

The height of the second upper wall 152 in the vertical direction is reduced with increase in distance from the third thin hole 150a. As a result, the height of the second upper wall 152 in the vertical direction is minimized at a position right above the center of the substrate 72. The height of the second lower wall 154 in the vertical direction is constant.

According to the configuration of the third embodiment, the gas flow passage can be rapidly purged like that in the film forming apparatus according to the first embodiment. The third thin hole 150a is constituted only by a straight hole which provides communication between the outside and the second cavity 150b. There is, therefore, no need to form a complicated hole such as the third thin hole 30a in the first embodiment. The number of third thin holes 150a is not limited to any particular number as long as it is plural.

According to the present invention, a flow passage is formed in which a gas can easily spread horizontally, so that the flow passage can be rapidly purged of the gas.

Obviously many modifications and variations of the present invention are possible in the light of the above teachings. It is therefore to be understood that within the scope of the appended claims the invention may be practiced otherwise than as specifically described.

What is claimed is:

1. A film forming apparatus comprising:
a susceptor; and
a shower head provided above the susceptor and having a first passage and a second passage independent of the first passage formed therein,
wherein the first passage is formed through the shower head by being provided with a first cavity surrounded by a first upper wall and a first lower wall and extending horizontally, a first thin hole formed in the first upper wall, and a plurality of second thin holes formed in the first lower wall;
the height of the first upper wall in the vertical direction is reduced with increase in distance from the first thin hole;
the height of the first lower wall in the vertical direction is constant;
the second passage is formed through the shower head by being provided with a second cavity surrounded by a second upper wall and a second lower wall and extending horizontally, a third thin hole formed in the second upper wall, and a plurality of fourth thin holes formed in the second lower wall;
the height of the second upper wall in the vertical direction is reduced with increase in distance from the bottom of the third thin hole;
the height of the second lower wall in the vertical direction is constant;
the first cavity is separated from the second cavity by the first lower wall and the second upper wall such that the first cavity and the second cavity are separated vertically in space but overlap horizontally in a plan view;
a flow passage from a center of an upper surface of the shower head to the first cavity is provided as the first thin hole;
a flow passage from a peripheral position in an upper surface of the shower head to the second cavity is provided as the third thin hole; and
the bottom of the third thin hole is connected to the center of the second upper wall in a plan view.

2. The film forming apparatus according to claim 1, wherein the first thin hole is formed in the first upper wall right above a center of the susceptor, and
wherein the third thin hole is formed in the second upper wall right above the center of the susceptor.

3. The film forming apparatus according to claim 1, further comprising an exhaust duct through which a gas provided onto the susceptor via the first thin hole, the first cavity and the plurality of second thin holes or via the third thin hole, the second cavity and the plurality of fourth thin holes and spreading outward beyond an outer edge of the susceptor is exhausted, and which has such a shape as to surround the shower head and the susceptor.

4. The film forming apparatus according to claim 1, further comprising a controller which supplies a first gas onto the susceptor by supplying the first gas to the first thin hole,
which purges the first passage of the first gas by supplying an inert gas to the first thin hole,
which supplies a second gas onto the susceptor by supplying the second gas to the third thin hole, and
which purges the second passage of the second gas by supplying an inert gas to the third thin hole.

5. The film forming apparatus according to claim 1, wherein the second thin holes and the fourth thin holes are round holes.

6. The film forming apparatus according to claim 1, wherein the susceptor has such a size that a wafer having a diameter equal to or larger than 300 mm is mounted on the susceptor.

* * * * *